United States Patent [19]

Linz et al.

[11] Patent Number: 4,843,394

[45] Date of Patent: Jun. 27, 1989

[54] DIGITAL-TO-ANALOG CONVERTER WITH NO OFFSET-INDUCED ERRORS

[75] Inventors: Alfredo R. Linz; Joe W. Peterson; Velayudhan V. Nair, all of Austin, Tex.

[73] Assignee: Advanced Micro Devices, Inc., Sunnyvale, Calif.

[21] Appl. No.: 146,459

[22] Filed: Jan. 21, 1988

[51] Int. Cl.$^4$ .............................................. H03M 1/78
[52] U.S. Cl. .................................... 341/154; 341/118
[58] Field of Search ................. 340/347 CC, 347 DA, 340/347 M; 341/118, 154, 158

[56] References Cited

U.S. PATENT DOCUMENTS 4,544,912  10/1985  Iwamoto et al. ............. 340/347 CC

OTHER PUBLICATIONS

"Analog-Digital Conversion Notes"; The Engineering Staff of Analog Devices, Inc.; 1980; pp. 117-118.

Primary Examiner—William M. Shoop, Jr.
Assistant Examiner—Marc S. Hoff
Attorney, Agent, or Firm—Davis Chin

[57] ABSTRACT

A digital-to-analog converter network for converting a digital signal having a plurality of binary bits into an analog output signal includes an R-2R ladder array (8a), a reference current source (IREF), a plurality of switches (S1, S2, ... S9) associated with ladder sections of the ladder array (8a), and an operational amplifier (14). An equalization circuit (17) is operatively coupled to the inverting input of the operational amplifier (14) for selectively switching in a code-dependent impedance so that the effective output impedance of the ladder array (8a) remains substantially constant with binary codes of the digital input signal.

1 Claim, 6 Drawing Sheets

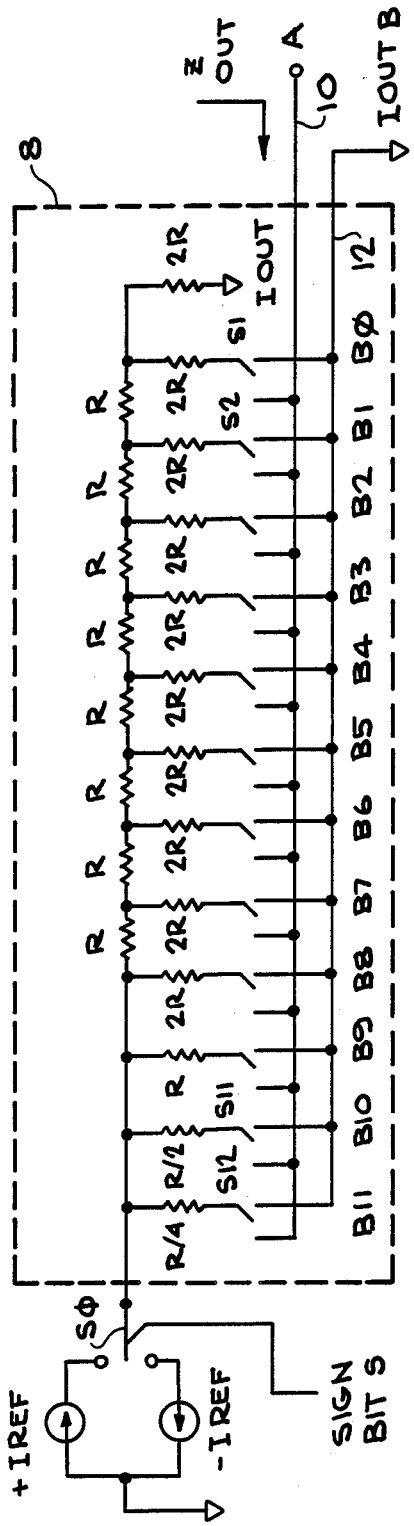
FIG. 1A *(PRIOR ART)*
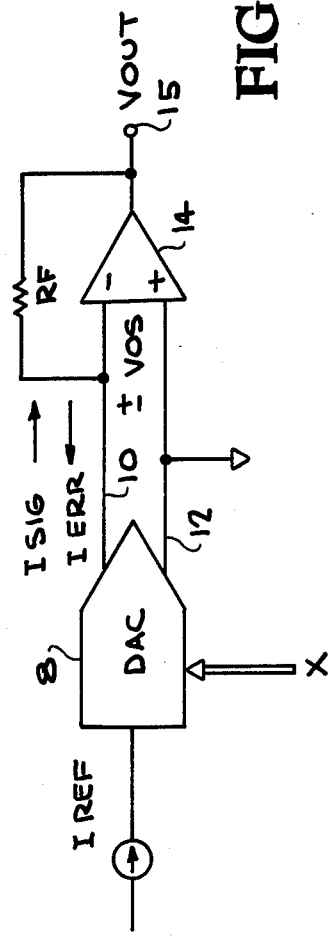
FIG. 1B *(PRIOR ART)*

DIGITAL-TO-ANALOG CONVERTER WITH NO OFFSET-INDUCED ERRORS

BACKGROUND OF THE INVENTION

This invention relates generally to digital-to-analog converters and more particularly, it relates to a digital-to-analog (D/A) converter network which includes a code-dependent impedance circuit for eliminating offset-induced errors caused by the use of an operational amplifier.

As is generally known, a major problem associated with digital-to-analog converters utilzing an R-2R ladder network is that when operated in a current mode the digital-to-analog converters are sensitive to offset voltage of the operational amplifier used to convert the output current to a voltage. A conventional R-2R ladder network for use with digital-to-analog converters is illustrated in FIG. 1(a) and is composed of equal-valued resistors R arranged in a uniform ladder array. Each subsection of the ladder array has a leg or rung of a "2R" element, and the connection between the ladder sections has a single "R" element joined between one ladder section and the next ladder section. Another single "R" element is also connected between the last single "R" element and a ground potential so as to complete the ladder array. This type of arrangement provides equal parallel "R" impedance at each node of the ladder array when going from the most significant bit (MSB) to the least significant bit (LSB). Thus, if the resistive elements are of a uniform resistance value a reference current applied to the input at the MSB end will divide equally at each ladder node so that the output current for each successive 2R ladder rung and thus each bit will be one-half of the output current of the previous bit down to the LSB. The uniform resistance value and node current division therefore implies that the voltage drop on each "R" element of the ladder array must decrease by one-half as well for each successive ladder section.

The R-2R ladder network has a first output current summing line 10 to provide an output current IOUT and a second output current summing line 12 to provide an output current IOUTB. Each "2R" leg is connected to respective switches S1, S2, . . . S12 which are controlled by binary bits B$\emptyset$, B1, . . . B11 of the digital input signal to be converted. Each of the switches S1, S2, . . . S12 is operated to switch current flowing through its respective leg between the first output line 10 and the second output line 12. Normally, the second output line 12 is tied to a reference node or in this case, a ground potential, and the first output line 10 is tied to an output node A. The output impedance $Z_{OUT}$ as seen across the output lines 10 and 12 varies dependent upon which ones of the "2R" legs are tied to the first output line 10 and which ones of the "2R" legs are tied to the second output line 12. In other words, the magnitude of this output impedance is different for every applied binary code X of the digital input signal. FIG. 2 is a plot of the typical variations of this output impedance $Z_{OUT}$ as a function of the binary code.

In FIG. 1(b), there is depicted in block form the digital-to-analog converter 8 of FIG. 1(a) whose output lines 10 and 12 are connected to an operational amplifier (op amp) 14 so as to form a D/A converter network. In particular, the first output line 10 is connected to the inverting input of the op amp 14, and the second output line 12 is connected to the non-inverting input of the op amp 14. The output voltage $V_{OUT}$ at output terminal 15 of the amplifier 14 provides an analog output voltage of the digital-to-analog converter network. The digital-to-analog converter 8 receives a reference current IREF and provides a signal $I_{SIG}$ on the output line 10. The signal $I_{SIG}$ is a signal current which is dependent upon the binary code X (i.e., B$\emptyset$, B1, . . . B11). This signal current constitutes the ideal output of the digital-to-analog converter 8. However, there will be an input dc-offset voltage $V_{OS}$ ranging from the order of 1 to 10 mV inherent to the op amp when using contemporary NMOS and CMOS technological processes.

As a result, this offset voltage is reflected or induced back into the converter 8 so as to cause an error current $I_{ERR}$ which is equal to $V_{OS}/Z_{OUT}$, where $Z_{OUT}$ is the output impedance across the first and second output lines 10 and 12 of the converter 8. Since the output imepedance $Z_{OUT}$ is dependent upon the binary code X, the error current will thus also be varying as a function of the binary code. Thus, the error current $I_{ERR}$ is subtracted or reduced from the signal current $I_{SIG}$ so as to render a resultant current $I_{RES}$. Since the error and signal currents cannot be separated, the output voltage $V_{OUT}$ of the amplifier 14 will be proportional to the resultant current $I_{RES}$, thereby causing distortion and adversely affecting the digital-to-analog conversion's accuracy and linearity.

In order to eliminate the problem of error current, there have been attempts in the prior art to make the output impedance $Z_{OUT}$ very large utilizing digitally controlled current sources. However, this solution suffers from the disadvantage in that it takes very large amounts of chip area where the digital-to-analog converter is more than five or six bits. There have also been proposed in the prior art means for cancelling of the offset voltage $V_{OS}$ of the op amp such as by utilizing auto-zeroing ciruitry. It has been encountered that this solution is also less than satisfactory since the auto-zeroing circuitry interacts with digital noise so as to degrade the overall operation of the digital-to-analog converter.

SUMMARY OF THE INVENTION

Accordingly, it is a general object of the present invention to provide an improved digital-to-analog converter which is relatively simple and economical to manufacture and assemble, but yet overcomes the disadvantages of the prior art converters.

It is an object of the present invention to provide a digital-to-analog converter network which has superior operating characteristics, particularly high linearity performance together with low distortion at low signal levels.

It is another object of the present invention to provide a digital-to-analog converter network which includes a code-dependent impedance circuit for eliminating offset-induced errors caused by the use of an operational amplifier.

It is another object of the present invention to provide a digital-to-analog converter network which includes equalization means operatively coupled to the inverting input of an operational amplifier for selectively switching in a code-dependent impedance so that the effective output impedance of an R-2R ladder array remains substantially constant with binary codes of a digital input signal.

It is still yet another object of the present invention to provide a digital-to-analog converter network which includes a code-dependent impedance circuit connected between the inverting input of an operational amplifier and a ground potential and a decode logic circuit responsive to binary code of a digital input signal for generating control signals to the codedependent impedance circuit.

In accordance with these aims and objectives, the present invention is concerned with the provision of a digital-to-analog converter network for converting a digital input signal having a plurality of binary bits into an analog output signal which includes an R-2R ladder array having 2R elements defining ladder sections corresponding in number to the number of binary bits and 1R elements connecting each of the ladder sections. A reference current source is applied to the input of the ladder array at the MSB end. A plurality of switches are provided each being associated with one of the ladder sections. The switches are controlled by a respective binary bit of the digital input signal for switching current flowing through its respective ladder sections between an output current summing line and a ground line. An operational amplifier has its inverting input connected to the summing line, its non-inverting input connected to the ground line, and its output connected to an output terminal to provide the analog output signal. The output impedance of the ladder array between the summing line and the ground line varies as a function of the binary codes of the digital input signal so as to create an offset-induced error current. An equalization circuit is operatively connected to the inverting input of the operational amplifier for selectively switching in a code-impedance so that the effective output impedance of the ladder array remains substantially constant with the binary codes.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1(a) is a schematic representation of a conventional digital-to-analog converter having an R-2R ladder array;

FIG. 1(b) illustrates in block diagram form the digital-to-analog converter of FIG. 1(a) connected to an operational amplifier;

DESCRIPTION OF THE PREFERRED EMBODIMENT

The present invention is directed generally to a method and an improved digital-to-analog (D/A) converter network which includes means for eliminating offset-induced errors caused by the use of an operational amplifier. The distortion effects due to the offset-induced errors have been avoided by converting the code-dependent error current signal into a DC current. This is accomplished by modifying the output impedance of the digital-to-analog converter to be substantially constant through the addition of a code-dependent impedance circuit.

Figure 3A:
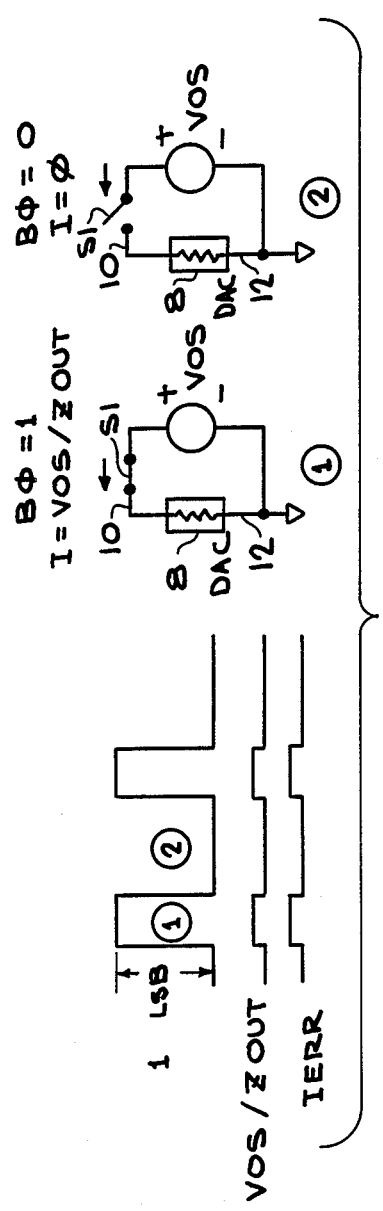
FIGS. 3(a) and 3(b) are diagrams useful in understanding the basic concept of the present invention.
Figure 3B:
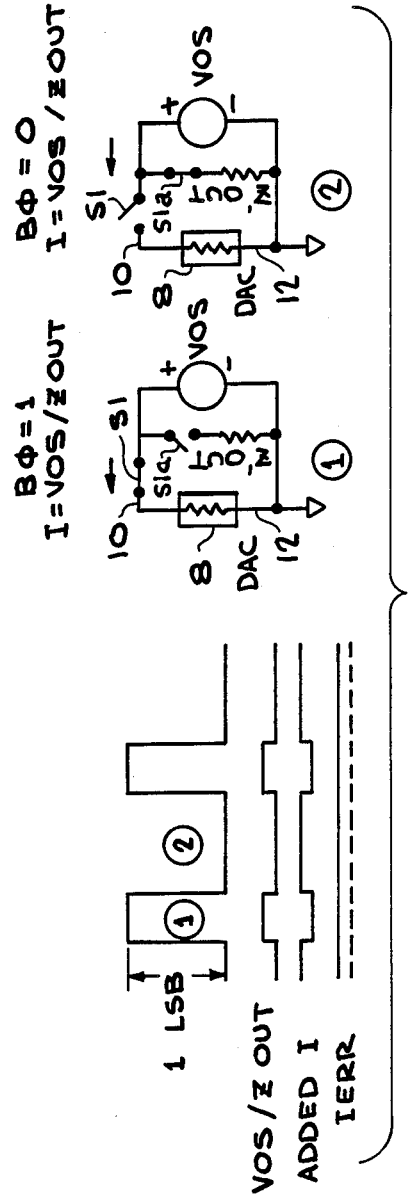

In order to explain the basic concept of the present invention, reference is made initially to FIGS. 3(a) and 3(b) of the drawings. For convenience of understanding, it is assumed only the least significant bit (LSB) or B$\emptyset$ is being switched. As can be seen from FIG. 3(a), when the binary code is "0" (B$\emptyset$=0), the switch S1 is turned off and the D/A converter 8 is effectively disconnected from the first output line 10 and thus the error current $I_{ERR}$ is equal to zero. When the binary code is "1" (B$\emptyset$=1), the switch S1 is turned on, and the resultant current is the sum of the LSB current plus the error current ($-I_{ERR}$ or $-V_{OS}/Z_{OUT}$). This variation of the error current due to the binary code being switched from a "0" to a "1" is what causes the distortion and linearity error.

As can be seen from FIG. 3(b), by adding an error current I to the output of the D/A converter 8 when the LSB current is turned off, which is of the same magnitude as when the LSB current is turned on, a substantially constant error current is produced at the output of the operational amplifier regardless of whether the binary code is at "0" or "1." This can be accomplished by switching an impedance $Z_{OUT}$ coupled between the output line 10 and a ground potential. The value of the impedance is selected to be equal to the impedance seen across the output lines 10 and 12 of the D/A converter 8 when the LSB current is turned on (B$\emptyset$=1). This is the equivalent of making the output impedance of the D/A converter 8 to have the same value whether each binary bit is at a "0" or "1" level. Accordingly, the effective output impedance of the D/A converter as a function of the binary codes is made tobe substantially flat.

For the purposes of illustration, there is shown in Table I listed below the following: Column one is the first 15 binary codes (0000 through 1111); column two is the approximate value of the conductance as seen from the D/A converter 8 of FIG. 1 (a); column three is the amount of extra conductance to be added; and column four is the total conductance.

TABLE I

| code | q out | q added | q total |
|---|---|---|---|
| 0 | 0 | g/2 + g/3 | g/2 + g/3 = 10g/12 |
| 1 | g/3 | g/2 | g/2 + g/3 = 10g/12 |
| 2 | g/3 | g/2 | g/2 + g/3 = 10g/12 |
| 3 | g/2 | g/3 | g/2 + g/3 = 10g/12 |
| 4 | g/3 | g/2 | g/2 + g/3 = 10g/12 |
| 5 | 7g/12 | g/3 | 11g/12 |
| 6 | g/2 | g/3 | g/2 + g/3 = 10g/12 |
| 7 | 7g/12 | g/3 | 11g/12 |
| 8 | g/3 | g/2 | g/2 + g/3 = 10g/12 |
| 9 | 5g/8 | g/3 | 11.5g/12 |
| 10 | 7g/12 | g/3 | 11g/12 |
| 11 | 17g/24 | g/3 | 12.5g/12 |
| 12 | g/2 | g/3 | g/2 + g/3 = 10g/12 |

TABLE I-continued

| code | q out | q added | q total |
|---|---|---|---|
| 13 | 17g/24 | g/3 | 12.5g/12 |
| 14 | 7g/12 | g/3 | 11g/12 |
| 15 | 5g/8 | g/3 | 11.5g/12 | g = 1/R

As can be seen from Table I, there are only two distinct values of correction conductances being used, namely, g/2 and g/3, where g is equal to 1/R. As will be recalled, the "R" element is the one used to interconnect the ladder sections. It should be readily apparent that a good degree of equalizing is achieved even though only two conductances are being selectively switched in. Further, it will be understood by those skilled in the art that any additional number of conductances could be added. However, this causes the decoding to be more complex. The number of correction impedances used becomes a trade-off between complexity and performance requirements.

Figure 4:
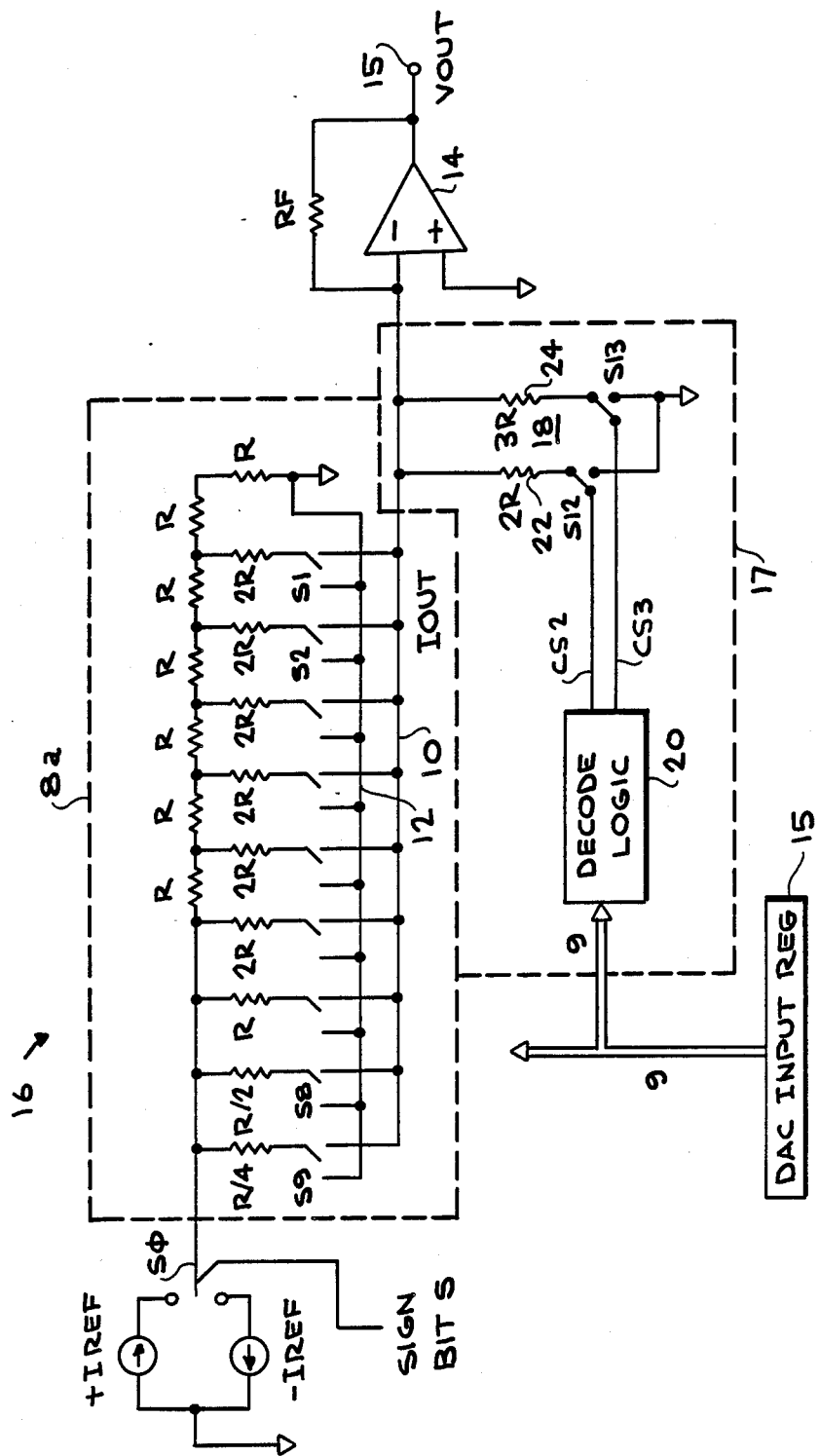
FIG. 4 is a schematic diagram illustrating an implementation of a 9-bit digital-to-analog converter network, constructed in accordance with the principles of the present invention.

Referring now to FIG. 4, there is shown a schematic diagram of an implementation of a 9-bit D/A converter network 16 which is constructed in accordance with the principles of the present invention. The D/A converter network 16 includes a D/A converter 8a, an operational amplifier 14, an input register 15, and an equalization network 17. The equalization network 17 includes a code-dependent impedance circuit 18 and a decode logic circuit 20. Since the D/A converter 8a is similar to the D/A converter of FIG. 1(a) and the connection of the D/A converter 8a to the operational amplifier 14 is also quite similar to FIG. 1(b), the details of the components and their interconnection will not be explained again. As can be seen, the D/A converter 8a differs from the D/A converter 8 in that it receives only a 9-bit digital input signal rather than a 12-bit digital input signal.

The reference current source is applied to the input of the ladder array at the MSB end with either a positive current +IREF or a negative current −IREF dependent upon the position of the switch S∅. The switch S∅ is controlled by a sign bit S, i.e., a binary bit indicating whether the digital input signal to be converted is positive or negative. The input register 15 is used to provide the 9-bit binary code of the digital input signal consisting of B∅, B1, . . . B8 as well as the sign bit S. The switches S1, S2, . . . S9 are controlled by the respective binary bits B∅, B1, . . . B8 for switching current flowing through the corresponding legs of the D/A converter between the first output current summing line 10 and the second output or reference line 12.

The code-dependent impedance circuit 18 is formed of a first resistor 22 and a second resistor 24. One end of the first resistor 22 is connected to the inverting input of the op amp 14. The other end of the resistor 22 is connected to a switch S12. The value of the resistor 22 is equal to 2R, where R is the value of the resistance connected between the ladder sections. Similarly, one end of the second resistor 24 is connected to the inverting input of the op amp 14. The other end of the resistor 24 is connected to a switch S13. The value of the resistor 24 is equal to 3R, where R is the value of the resistance connected between the ladder sections. The switches S12 and S13 are controlled by control signals CS2 and CS3 from the decode logic circuit 20 to selectively switch in or add conductance between the inverting input of the op amp and the ground potential so that the effective output impedance of the D/A converter 8a will remain substantially constant with the binary codes of the digital input signal.

Figure 5:
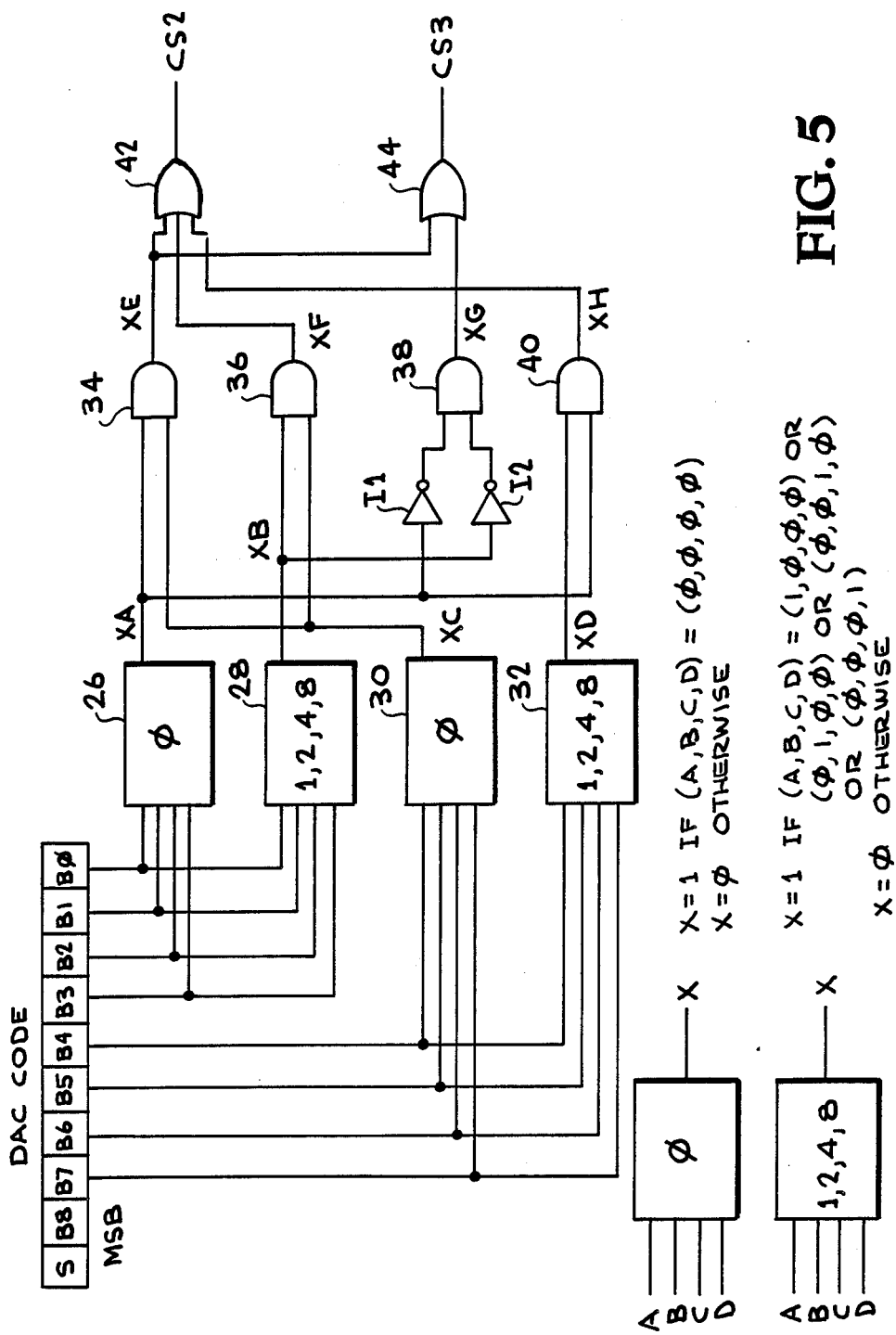
FIG. 5 is a basic block diagram of the decode logic circuit of FIG. 4.

The decode logic circuit 20 includes logic circuits for decoding the 9-bit binary code of the digital input signal received from the input register 15 for generating the control signals CS2 and CS3. A basic block diagram of the decode logic circuit 20 for use in FIG. 4 is illustrated in FIG. 5. As can be seen, the decode logic circuit 20 includes a first logic block 26, a second logic block 28, a third logic block 30, a fourth logic block 32, AND logic gates 34-40, inverters I1 and I2, and OR logic gates 42, 44. The first and second logic blocks 26 and 28 receive the binary bits B∅. . . B3, and the third and fourth logic blocks 30 and 32 receive the binary bits B4...B7. The first logic block 26 generates a logic signal XA which is high when (B∅, B1, B2, B3)=(0, 0, 0, 0) and is low otherwise. The second logic block 28 generates a logic signal XB which is high when (B∅, B1, B2, B3)=(1, 0, 0, 0) or (0, 1, 0, 0) or (0, 0, 1, 0) or (0, 0, 0, 1) and is low otherwise. Similarly, the third logic block 30 generates a logic signal XC which is high when (B4, B5, B6, B7)=(0, 0, 0, 0) and is low otherwise. The fourth logic block 32 generates a logic signal XD which is high when (B4, B5, B6, B7)=(1, 0, 0, 0) or (0, 1, 0, 0) or (0, 0, 1, 0) or (0, 0, 0, 1) and is low otherwise.

The AND logic gate 34 receives as inputs the logic signal XA and XC; the AND logic gate 36 receives as inputs the logic signal (XB and XC; the AND logic gate 38 receives as input signals the logic signal XA via he inverter I1 and the logic signal XB via the inverter I2; and the AND logic gate 40 receives the logic signals XD and XA. The AND logic gates 34, 36, 38 and 40 generate respective logic signals XE, XF, XG and XH. The OR logic gate 42 receives the logic signals XE, XF and XH and generates the control signal CS2 which is used to control the switch S12 in the code-dependent impedance circuit 18. The OR logic gate 44 receives the logic signals XG and XH and generates the control signal CS3 which is used to control the switch S13 in the code-dependent impedance circuit 18.

Figure 2:
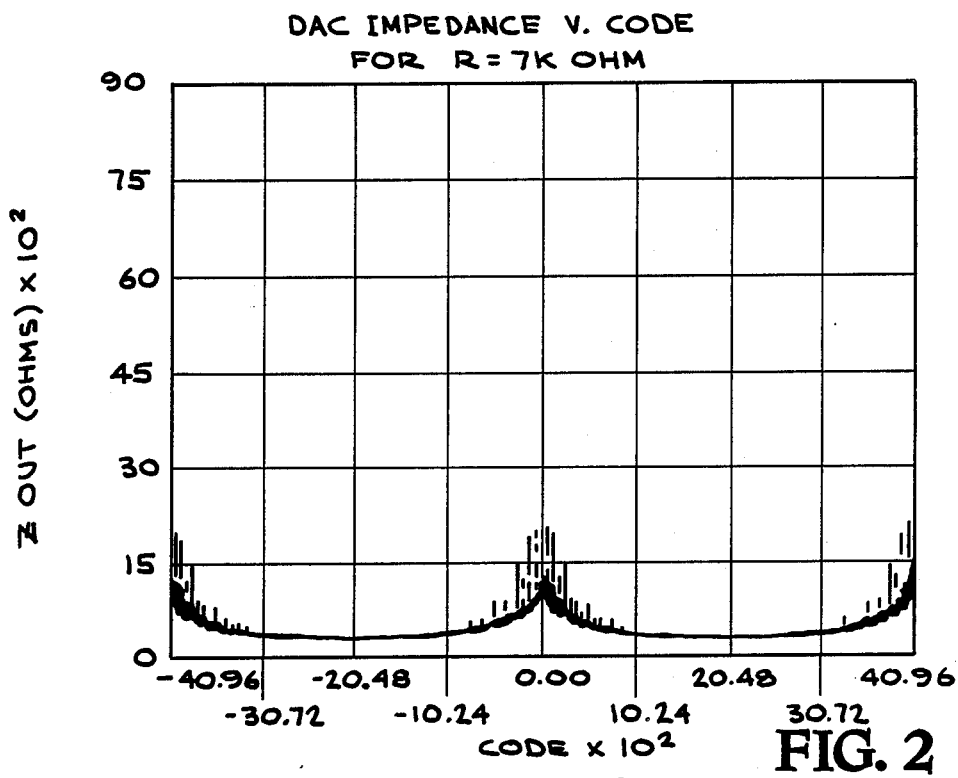
FIG. 2 is a plot of the typical variations of the output impedance of a digital-to-analog converter as a function of the binary codes.
Figure 6:
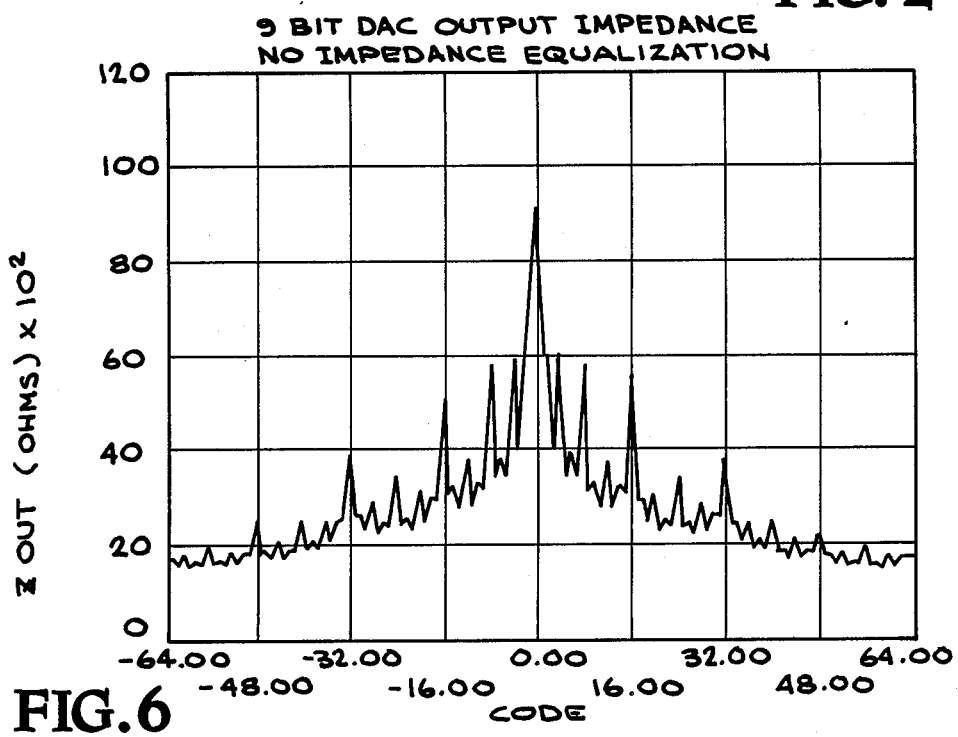
FIG. 6 is a plot of the output impedance of the converter of FIG. 4 for the first sixty-four codes without the equalization network connected.
Figure 7:
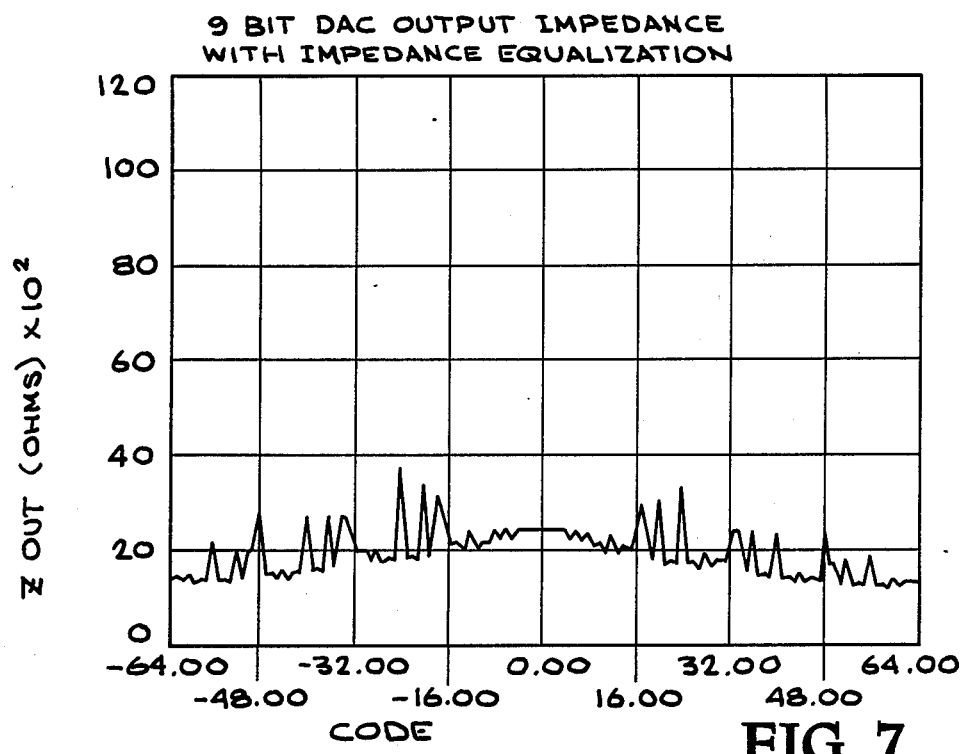
FIG. 7 is a plot of the output impedance of the converter of FIG. 4 for the first sixty-four codes with the equalization network connected.
Figure 8:
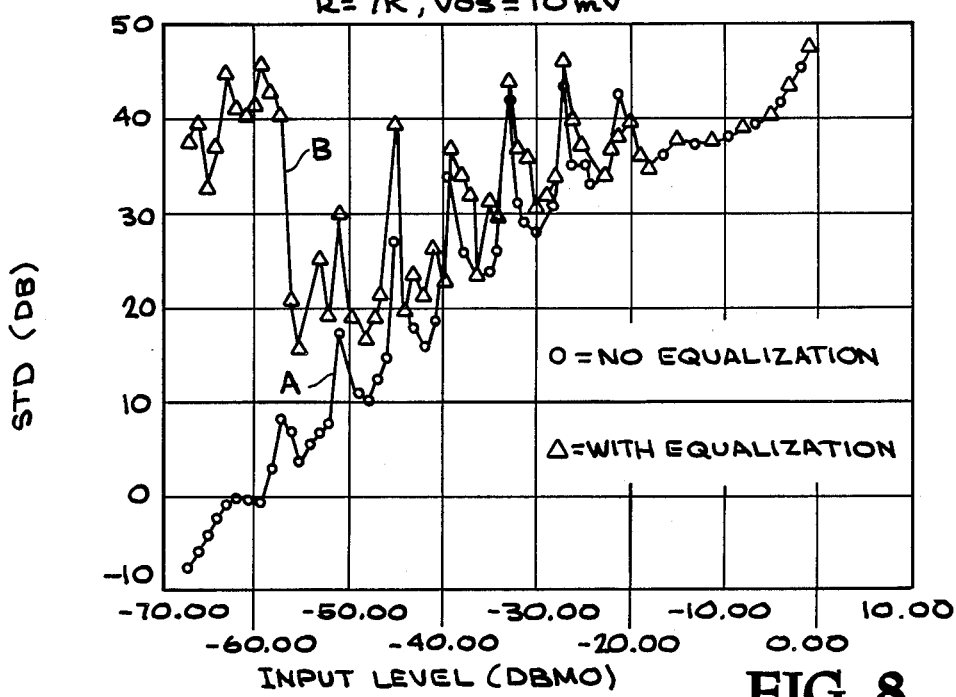
FIG. 8 shows plots of simulated signal-to-distortion ratios as a function of input levels.

FIG. 6 is a plot of the output impedance of the 9-bit D/A converter 8a of FIG. 4 for the first sixty-four code without the equalization network 17 connected. FIG. 7 is a similar plot of the output impedance of the 9-bit D/A converter 8a of FIG. 4 for the first sixty-four code with the equalization network 17 connected. By comparison of FIGS. 6 and 7, it can be seen that the output impedance of FIG. 7 has been made to be substantially constant. The impedance switching may also be performed for the higher codes so as to reduce the peaks of the impedance function. In order to determine the final effect on the signal-to-distortion (STD) ratio, a computer simulation is required to be done. FIG. 8 is a plot of a simulated signal-to-distortion ratio as a function of input level for a 12-bit (+sign) digital-to-analog converter network, where the value of R is equal to 7 Kilohms and the offset voltage $V_{OS}$ is 10 mV. Curve A of FIG. 8 shows the signal-to-distortion ratio when the code-dependent impedance circuit is not connected. Curve B of FIG. 8 shows the signal-to-distortion ratio when the code-dependent impedance circuit is connected.

While only 9 bits have been shown in FIG. 4, it should be clearly understood that the digital-to-analog converter 8a may be modified to accommodate any number of binary bits as desired by adding or subtracting ladder sections and that the correction principle holds true for any implementation of the resistors within the digital-to-analog converter, including polysilicon resistors, thin-film resistors, p-well diffusion resistors, or MOS transistors being used as voltage-controlled resistors. Even though an infinite number of ladder sections is theoretically possible, the actual number is controlled by the physical limitation of the operational amplifier 14.

From the foregoing detailed description, it can thus be seen that the present invention provides an improved method and D/A converter network which includes means for eliminating offset-induced errors caused by the use of an operational amplifier. Further, the D/A converter network includes an equalization circuit operatively connected to the inverting input of the operational amplifier for selectively switching in a code-dependent impedance so that the effective output impedance of the ladder array remains substantially constant with binary codes of the digital input signal.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A digital-to-analog converter network for converting a digital input signal having a plurality of binary bits into an analog output signal comprising:

an R-2R ladder array (8a) having 2R elements defining ladder sections corresponding in number to the number of binary bits and 1R elements connecting each of the ladder sections;

a reference current source (IREF) being applied to the input of said ladder array (8a) at the MSB end;

a plurality of switch means (S1, S2, ... S9) each being associated with one of the ladder sections and being controlled by a respective binary bit of the digital input signal for switching current flowing through its respective ladder sections between an output current summing line (10) and a reference line (12);

an operational amplifier (14) having its inverting input connected to the summing line (10), its non-inverting input connected to the reference line (12), and its output connected to an output terminal (15) to provide the analog output signal;

said ladder array (8a) having an output impedance between the summing line (10) and the reference line (12) which varies as a function of binary codes of the digital input signal so as to create an offset-induced error current;

equalization means (17) operatively connected to the inverting input of said operational amplifier (14) for selectively switching in a code-dependent impedance so that the effective output impedance of the ladder array (8a) remains substantially constant with said binary codes;

said equalization means (17) including a code-dependent impedance circuit (18) connected between the inverting input of said operational amplifier (14) and the ground potential and a decode logic circuit (20) responsive to the binary codes for generating control signals (CS2, CS3) to said code-dependent impedance circuit (18); and said code-dependent impedance circuit (18) including a plurality of resistors (22, 24) and a corresponding number of impedance switches (S12, S13), each resistor having one end connected to the inverting input of said operational amplifier (14) and its other end connected to a respective impedance switch, said impedance switches (S12, S13) being responsive to a corresponding control signal for selectively connecting said corresponding resistor to the ground potential.

* * * * *